United States Patent [19]
Griffin, IV et al.

[11] Patent Number: 5,950,073
[45] Date of Patent: Sep. 7, 1999

[54] SELF-ADJUSTING SEMICONDUCTOR PACKAGE STAND-OFFS

[75] Inventors: Michael J. Griffin, IV, Poughkeepsie; Lovell B. Wiggins, Hopewell Junction, both of N.Y.

[73] Assignee: International Business Machines Corporation, Armonk, N.Y.

[21] Appl. No.: 08/932,568

[22] Filed: Sep. 19, 1997

[51] Int. Cl.⁶ .................................................. H01L 21/44
[52] U.S. Cl. ........................... 438/119; 438/612; 257/704
[58] Field of Search ..................................... 438/118, 119, 438/612; 257/704

[56] References Cited

U.S. PATENT DOCUMENTS

| | | | |
|---|---|---|---|
| 5,168,344 | 12/1992 | Ehlert et al. | 257/701 |
| 5,471,027 | 11/1995 | Call et al. | 438/118 |
| 5,641,713 | 6/1997 | Kyle | 438/118 |
| 5,656,551 | 8/1997 | Curbett et al. | 438/118 |
| 5,801,074 | 9/1998 | Kim et al. | 438/118 |
| 5,821,161 | 10/1998 | Covell, II et al. | 257/704 |

*Primary Examiner*—Kevin M. Picardat
*Attorney, Agent, or Firm*—H. Daniel Schnurmann

[57] ABSTRACT

A semiconductor package structure that includes placing self-adjusting stand-offs between the substrate and sealband of the cap, such that the gap between the cap and the chip can be controlled, thereby improving the thermal and fatigue performance of the overall package. The height of the stand-off is varied by controlling the application (i.e., the temperature and the timing) of the heat that is used by the soldering process normally used in the generation of solder joints. The control of the soldering procedure is calibrated to optimize the amount of the stand-off which is dissolved, melted and spalled until the optimum height of the stand-off is reached.

34 Claims, 3 Drawing Sheets

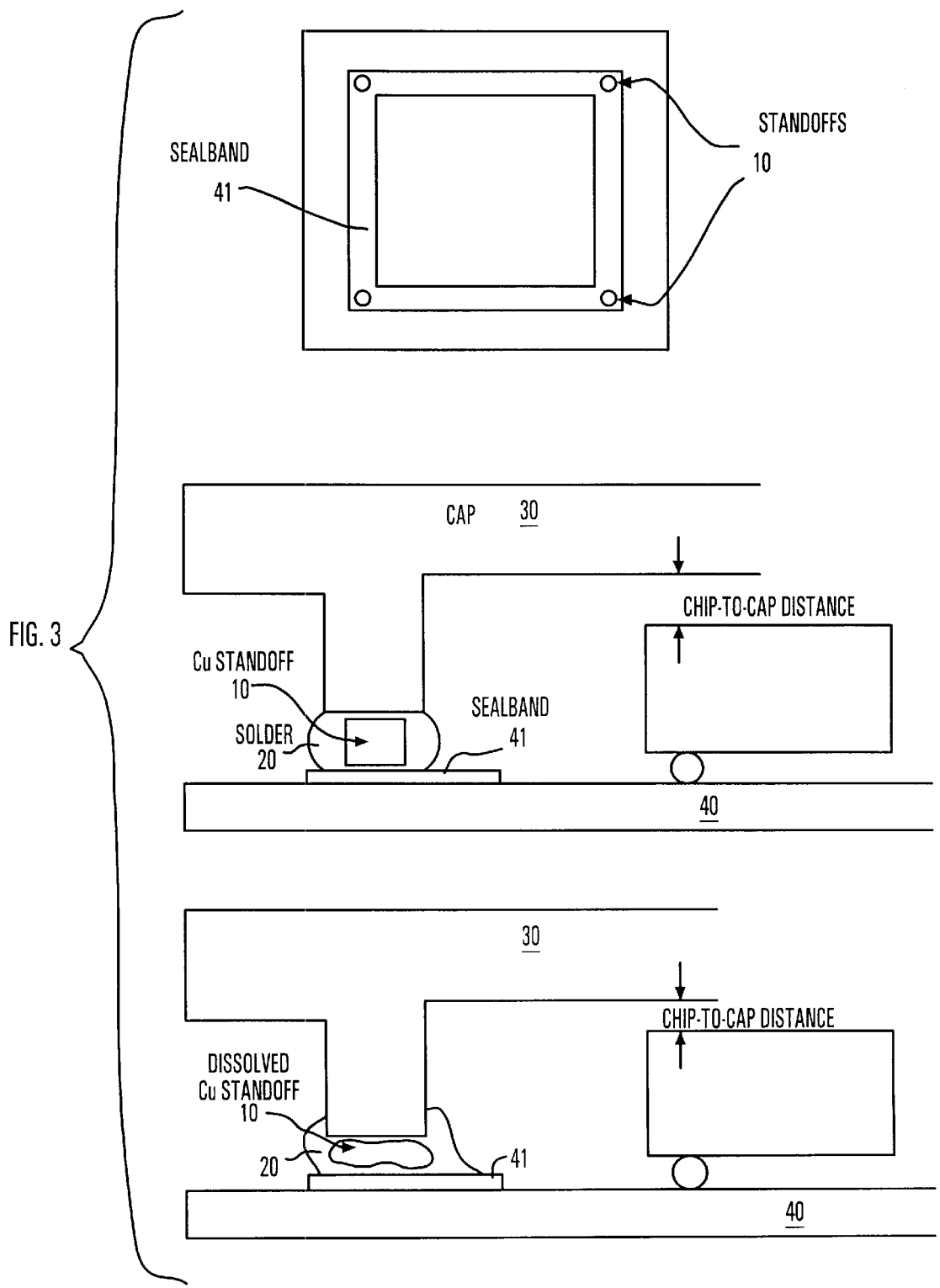

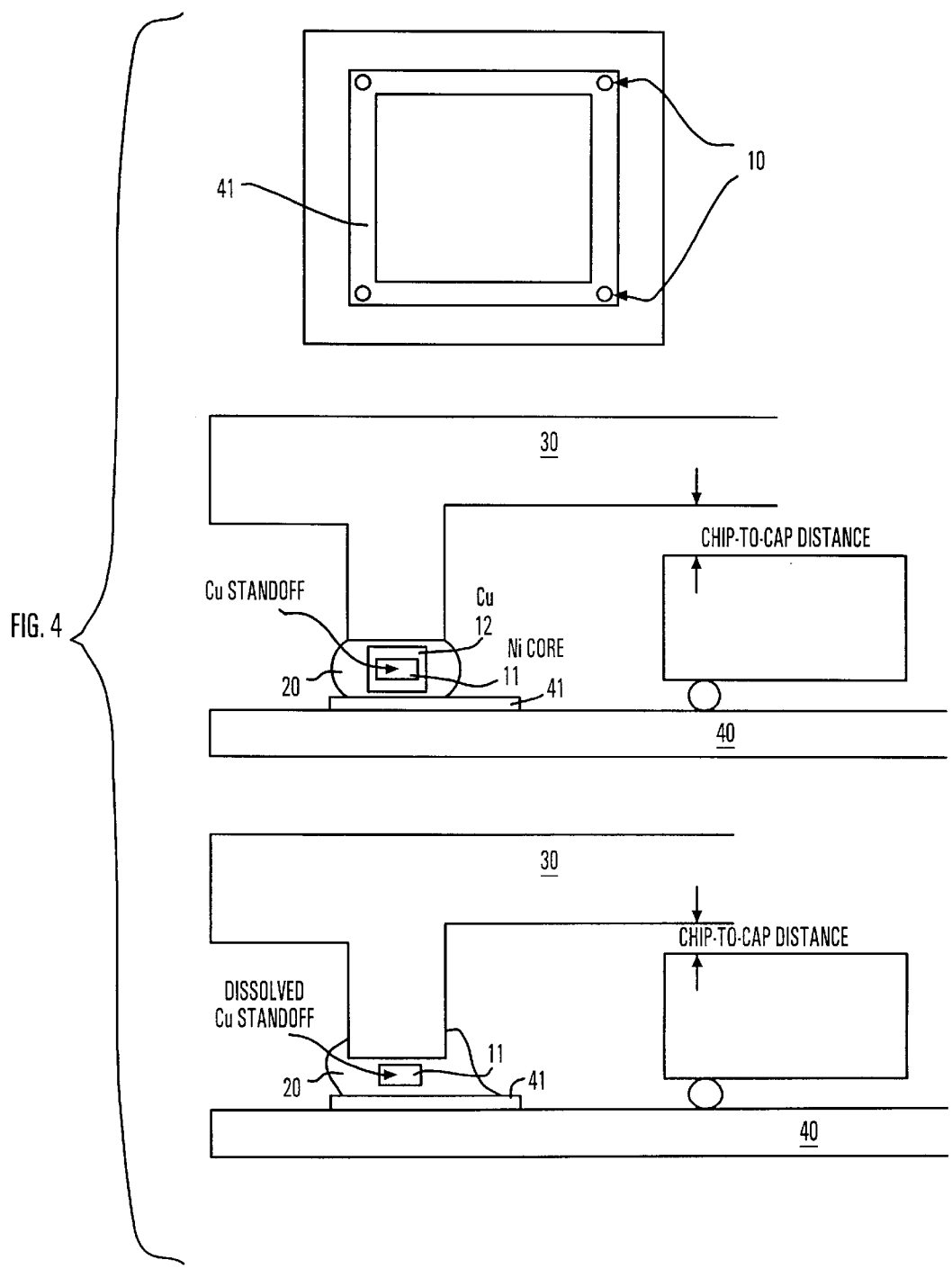

SELF-ADJUSTING SEMICONDUCTOR PACKAGE STAND-OFFS

FIELD OF THE INVENTION

This invention relates generally to hermetically sealing semiconductor integrated circuit (IC) chips, and more particularly, to a method of placing self-adjusting stand-offs between the substrate and sealband of the cap, such that the gap between the cap and the chip can be controlled, thereby improving the thermal and fatigue performance of the overall package.

BACKGROUND OF THE INVENTION

It is well known in the art of packaging semiconductor IC chips (in modules, cards, etc.) that chips must be properly sealed within the package and appropriately heat sinked in order to achieve good thermal management. This makes it possible to dissipate the heat generated by the chips and avoid extreme temperatures that may damage the chips or, at the very least, negatively impact their reliability.

In a hermetic single or multi-chip package, the chip is attached to the substrate and is then covered with a metal or ceramic cap which is soldered around the periphery of the substrate to isolate the chip from the ambient environment. Typically, the interior of the cap is filled with a thermally conductive but electrically non-conductive paste to efficiently remove the heat from the chip and dissipate it through the package as it is generated. This allows an even flow of heat from the chip to the cap without causing any electrical shorts. The heat thus conducted to the cap is radiated into the ambient air or removed via liquid cooling.

Practitioners of the art will fully realize that meeting chip performance specifications is tightly linked to the effective and predictable operation of the thermal path from the chip to the cap, and from there to the ambient air (or cooling medium).

An essential requirement to achieve an optimum heat management is to tightly control the chip-to-cap distance. The shorter the distance the better the thermal path. Yet, if the distance is too short, there is a possibility of risking a short in addition to an uneven thermal dissipation which, in an extreme case, may even damage the chips. Furthermore, variations in the cap dimensions, chip thickness (i.e., height) and chip-to-substrate bonding, all jointly work to force greater variation from the optimum chip-to-cap distance.

It is also known in the art, that variations in chip height exist in any multi-chip package. These variations are compounded when they combine with variations in the diameter of C4 pads (controlled collapsable chip connection) which attaches a chip to the substrate. Thus, when a cap is designed, the height of the cap pedestal in combination with the stand-offs must accommodate these variations. This can result in extra space which is not required by all the chips within the package, and makes the dissipation of heat become highly inefficient.

A less desirable approach to solve this problem is to stock up caps having differing heights to accommodate the aforementioned variations. This, clearly, has the serious disadvantage of keeping a substantial quantity of multiple part numbers and procedures, which will determine which cap size is to be used and which procedure is best suited to achieve optimum thermal performance for the package under consideration. Obviously, such a solution is not practical to any manufacturing operation.

OBJECTS OF THE INVENTION

Accordingly, it is an object of the invention to improve the thermal management of an integrated circuit chip package by controlling the spacing between the cap and the chips.

It is another object to realize this thermal improvement by placing self-adjusting stand-offs between the substrate and the cap to control the gap between the cap and the chip.

It is yet another object to vary the height of the stand-offs by controlling the application of heat used by soldering in conjunction with the force applied to the cap.

It is a further object to achieve an absolute minimum chip-to-cap distance while still maintaining electrical isolation and reliability of the thermal path.

It is still another object to allow the cap to settle during the soldering operation to allow the thermal paste to outgass, liquify, and flow properly.

SUMMARY OF THE INVENTION

In a first aspect of the present invention there is provided a structure that includes placing stand-offs between the substrate and the cap to optimize the gap between the cap and the chip.

In a preferred embodiment, there is provided a self-adjusting semiconductor package structure that includes: at least one integrated circuit chip mounted on a substrate; a cap hermetically sealing said substrate; and at least one self-adjusting stand-off positioned between said cap and said substrate.

In another preferred embodiment, there is provided a method of hermetically sealing a semiconductor package having a substrate with at least one integrated circuit chip mounted thereon, the method including the steps of: a) capping said substrate with a cap; b) filling said cap with thermally conductive material; c) placing a self-adjusting stand-off between said substrate and said cap; d) embedding said self-adjusting stand-off in soldering material; and e) partially dissolving said self-adjusting stand-off and said soldering material to control the spacing between said cap and said substrate.

BRIEF DESCRIPTION OF THE DRAWINGS

The accompanying drawings, which are incorporated in and constitute part of the specification, illustrate presently a preferred embodiment of the invention, and together with the general description given above and the preferred embodiment given below, serve to explain the structure of the invention.

FIGS. 3 and 4 show two schematic diagrams of the structures shown in FIGS. 1 and 2, using a cube (instead of a spherical) stand-off, respectively with and without an inner core.

DETAILED DESCRIPTION OF THE PREFERRED EMBODIMENT

The invention will now be explained by way of an embodiment in a form of a bimetal stand-off positioned between the pedestal forming the cap and the sealing surface of a substrate.

Figure 1:
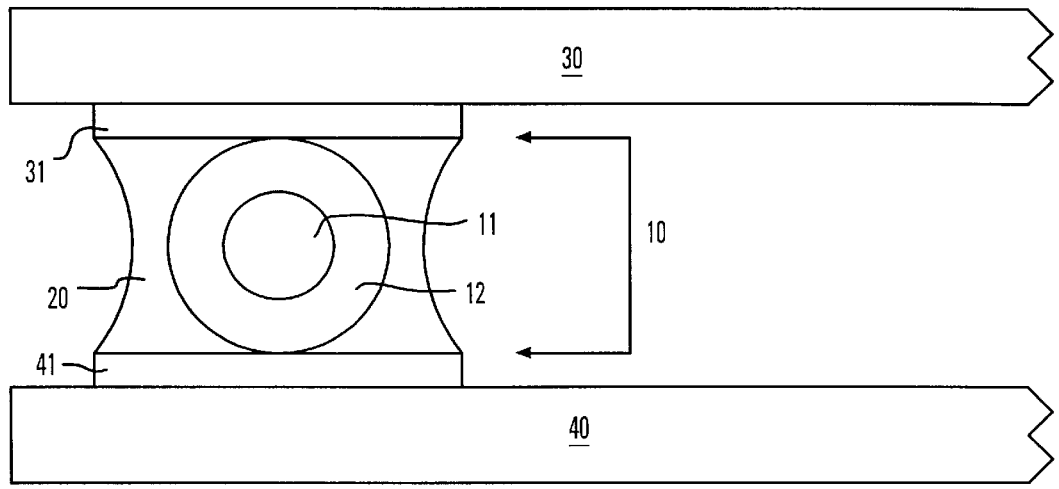
FIG. 1 is a schematic diagram of a cross-section of the substrate and cap with a stand-off positioned therebetween, in accordance to the invention prior to the reflow of the solder and reaction of the reactive shell.

Referring to FIG. 1, there is shown a schematic diagram of a cross-section of a substrate 40 and a cap 30 separated from each other by a stand-off 10.

The stand-off 10 consists of a core 11, preferably made of nickel, surrounded by an outer shell 12, preferably made of copper. The stand-off is enveloped by a solder joint 20 having dimensions ranging, for reliability purposes, between 90 μm and 130 μm. The points of contact between the stand-off and the cap, on one hand, and the substrate and the stand-off, on the other, are respectively connected to seal-bands 31 and 41, preferably made of Au—Ni.

The nickel forming the inner core 11 of the stand-off 10 has the advantage that the nickel reacts with the solder joint, and ultimately the reaction slows down to a point where the Ni no longer reacts altogether.

A viscous thermal paste (not shown) is applied between the chip and the cap to remove heat generated by the chip and to conduct the heat away from the chip and into the ambient. The paste is applied to the cap prior to it being attached to the substrate. A weight is placed on the cap to maintain intimate contact between the assembly surfaces while the assembly passes through a furnace to reflow the solder. During the heating process, several events must happen for the cap joining to be successful. First, the thermal paste must flow on heating and must outgass. Second, the volatile gasses under the cap have to escape, and third, the solder must melt. Once the solder finishes melting, the weight causes the cap to settle to the thickness of the stand-off.

Oftentimes, the step of the outgassing volatile gasses and the concurrent lowering of the viscosity of the thermal paste is not yet complete by the time the cap settles in place. When this happens, a hole may be created by the blowing of the gasses attempting to find a path through a narrow wide solder joint, or the C4 solder joints may end up being squashed, or the pressure applied by the still viscous paste may break the chip.

Accordingly, in the preferred embodiment, the Ni stand-off is plated with a reactive material such as Cu, and may adopt any desired shape, i.e., a ball, disk, or cube. Experiments have determined that a Cu feature having the same size as the Ni feature (i.e., 100 μm) will completely dissolve in molten solder, while the Ni feature will only react at the surface. By plating the Ni feature (i.e., ball, disk, cube, and the like) with Cu makes it possible to control the rate at which the cap will react its final position on the substrate.

The bimetal stand-off 10 is formed initially with a Ni ball or disk 11, which is then plated with Cu or any other metal such as Au and the like, to a thickness roughly equivalent to the diameter of the ball/disk, and such that the optimum thickness of the sacrificial metal may be appropriately varied in accordance with each application. The stand-off is then imbedded in a solder preform place 41 present on the substrate 40. If solder paste is used, then paste is applied on the substrate 40 sealing surface 41 and the stand-off is embedded inside the thermal paste. Both the preform 40, the stand-off 10 and the paste may be reflowed (i.e., melted) prior to placing the cap 30 on the substrate. Preferably, the sealing surface of the cap 30 is positioned above the preform 31 or on the thermal paste.

Figure 2:
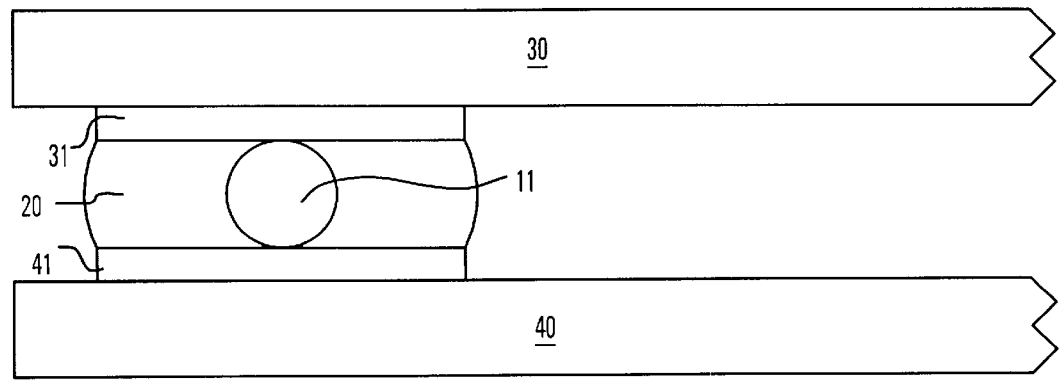
FIG. 2 is a schematic diagram of the same structure shown in FIG. 1, after reflow of the solder and showing the reaction of the copper with the tin of the lead/tin solder and the subsequent dispersion of the resulting intermetallics into the bulk of the solder.

Referring now to FIG. 2, the cap 30 is joined to the surface 40 by reflowing the assembly at a temperature above the melting point of the solder that was selected. If the solder consists of eutectic PbSn, then the reflow must suffice to allow the solder to react with the sacrificial coating 12 and disperse in the solder joint 20, thereby allowing the cap 30 to settle on the less reactive core 11, thereby making it possible to achieve the required thickness of the solder joint 20.

Inspection will find intermetallics on the cap sealing surface 31, the core surface 11, and the substrate sealing surface 41. The intermetallic dispersed in the solder joint 20 around the core 11 will predominantly be Cu and Sn, while the intermetallics on the surface of the cap sealing surface 31, and on the sealing substrate surface 41 will predominantly be Ni and Sn. The intermetallic on the core surface 11 will contain Ni, Cu and Sn. If Au were used on the sealing surfaces of the cap 30, on the stand-off 10 and/or on the substrate 40, then Au will likely also be found in the respective combinations of Cu—Sn and of Ni—Sn intermetallics.

FIGS. 3 and 4 show a structure similar to FIGS. 1 and 2, but a cubic stand-off with an inner core (FIG. 3) and without an inner core (FIG. 4) is used instead of a spherical.

Additional advantages and modifications will readily occur to those skilled in the art. Therefore, the invention in its broader aspects is not limited to the specific details, and the representative structure shown and described herein. Accordingly, various modifications, particularly, those referring to the composition of the stand-offs, the selection of material may be made without departing from the spirit or scope of the general inventive concept as defined by the appended claims and their equivalents.

What is claimed is:

1. A method of hermetically sealing a semiconductor package having a substrate with at least one integrated circuit chip mounted thereon, comprising the steps of:
    a) capping said substrate with a cap;
    b) placing a self-adjusting stand-off between said substrate and said cap, said self-adjusting stand-off being provided with a dimensionally defining component; and
    c) partially dissolving said self-adjusting stand-off to control the spacing between said cap and said substrate, said spacing being further defined by said dimensionally defining component.

2. The method of claim 1, further comprising the step of applying force to said cap while said self-adjusting stand-offs are dissolving.

3. A method of hermetically sealing a semiconductor package having a substrate with at least one integrated circuit chip mounted thereon, comprising the steps of:
    a) capping said substrate with a cap;
    b) filling said cap with thermally conductive material;
    c) placing a self-adjusting stand-off between said substrate and said cap, said self-adjusting stand-off being provided with a dimensionally defining component; and
    d) partially dissolving said self-adjusting stand-off and said soldering material to control the spacing between said cap and said substrate, said spacing being further defined by said dimensionally defining component.

4. The method of claim 3, further comprising heating said thermally conductive gas prior to said cap settling on said self-adjusting stand-offs.

5. The method of claim 3, wherein said thermally conductive material is a paste.

6. The method of claim 5, further comprising the steps of heating said paste, outgassing said paste, inducing volatiles generated during said heating to escape, and melting said soldering material.

7. The method of claim 3, further comprising plating said self-adjusting stand-off with a reactive material.

8. The method of claim 5, wherein said reactive material is Cu.

9. A method of hermetically sealing a semiconductor package having a substrate with at least one integrated circuit chip mounted thereon, comprising the steps of:

a) capping said substrate with a cap;

b) filling said cap with thermally conductive material;

c) placing a self-adjusting stand-off between said substrate and said cap, said self-adjusting stand-off being provided with a dimensionally defining component;

d) embedding said self-adjusting stand-off in soldering material; and e) partially dissolving said self-adjusting stand-off and said soldering material to control the spacing between said cap and said substrate, said spacing being further defined by said dimensionally defining component.

10. The method of claim 9, wherein said soldering material forms a solder joint.

11. The method of claim 9, further comprising plating said self-adjusting stand-off with a reactive material.

12. The method of claim 11, wherein said reactive material is Cu.

13. The method of claim 9, wherein said self-adjusting stand-off has an inner core surrounded by an outer shell.

14. The method of claim 13, wherein said inner core is made of Ni and said outer shell is made of Cu.

15. The method of claim 14, wherein said Cu disperses in said solder joint allowing said self-adjusting stand-off to settle on said inner core thereby achieving a desired thickness of said solder joint.

16. The method of claim 9, further comprising the step of applying force to said cap while said self-adjusting stand-offs are dissolving.

17. A self-adjusting semiconductor package structure, comprising: at least one integrated circuit chip mounted on a substrate;

a cap hermetically sealing said substrate; and at least one self-adjusting standoff positioned between said cap and said substrate, said at least one self-adjusting stand-off comprising a dimensionally reducing component and a dimensionally defining component, said dimensionally reducing component adjusting the dimension of the height of said self-adjusting stand-off to a height intermediate between an initial height and a final height defined by said dimensionally defining component.

18. The self-adjusting semiconductor package structure of claim 17, wherein said self-adjusting stand-off is made of Cu.

19. A self-adjusting semiconductor package structure of claim 17, wherein said dimensionally defining component is an inner core surrounded by said dimensionally reducing component providing an outer core.

20. The self-adjusting semiconductor package structure of claim 19, wherein said inner core is made of Ni and said outer shell is made of Cu.

21. The self-adjusting semiconductor package structure of claim 20, wherein said Ni inner core is plated with Cu.

22. The self-adjusting semiconductor package structure of claim 17, wherein said self-adjusting stand-off is attached to sealbands respectively attached to said cap and to said substrate.

23. The self-adjusting semiconductor package structure of claim 22, wherein said sealbands are made of Au and Ni.

24. A self-adjusting semiconductor package structure, comprising:

at least one integrated circuit chip mounted on a substrate;

a cap hermetically sealing said substrate; thermally conductive paste filling the inside of said cap; and at least one self-adjusting stand-off positioned between said cap and said substrate, wherein the space separating said cap from said substrate is controlled by a dimensionally defining component surrounded by a dimensionally reducing component, and the amount of heating to which said at least one self-adjusting stand-off is subjected to.

25. The self-adjusting semiconductor package structure of claim 24, wherein said thermally conductive paste is applied to said cap prior to mating said cap to said substrate.

26. The self-adjusting semiconductor package structure of claim 24, wherein said thermally conductive paste is outgassed prior to hermetically sealing said cap to said substrate.

27. The self-adjusting semiconductor package structure of claim 26, wherein volatile gasses escape from the package while said thermally conductive paste is outgassing.

28. A self-adjusting semiconductor package structure, comprising:

at least one integrated circuit chip mounted on a substrate;

a cap hermetically sealing said substrate;

thermally conductive paste filling the inside of said cap; and embedded in soldering material, at least one self-adjusting stand-off positioned between said cap and said substrate, said self-adjusting stand-off being provided with a dimensionally defining component, wherein space separating said cap from said substrate is controlled by melting said soldering material and by said dimensionally defining component.

29. The self-adjusting semiconductor package structure of claim 28, wherein said soldering material surrounding said self-adjusting stand-off forms a soldering joint.

30. The self-adjusting semiconductor package structure of claim 29, wherein said soldering joint has a thickness ranging from 90 $\mu$m to 130 $\mu$m.

31. The self-adjusting semiconductor package structure of claim 29, wherein said self-adjusting stand-off has an inner core surrounded by an outer shell.

32. The self-adjusting semiconductor package structure of claim 29, wherein said inner core is made of Ni and said outer shell is made of Cu.

33. The self-adjusting semiconductor package structure of claim 29, wherein said outer shell disperses within said soldering joint, thereby allowing said cap to settle on said inner core.

34. The self-adjusting semiconductor package structure of claim 29, wherein force is applied to said cap while the melting of said soldering material is occurring.

* * * * *